(12) United States Patent
Wang et al.

(10) Patent No.: US 12,342,585 B2
(45) Date of Patent: Jun. 24, 2025

(54) SEMICONDUCTOR STRUCTURE AND FABRICATION METHOD THEREOF

(71) Applicant: UNITED MICROELECTRONICS CORP., Hsin-Chu (TW)

(72) Inventors: Chia-Ling Wang, Yunlin County (TW); Ping-Hung Chiang, Hsinchu (TW); Wei-Lun Huang, Tainan (TW); Chia-Wen Lu, Chiayi County (TW); Ta-Wei Chiu, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 582 days.

(21) Appl. No.: 17/577,403

(22) Filed: Jan. 18, 2022

(65) Prior Publication Data

US 2023/0207620 A1    Jun. 29, 2023

(30) Foreign Application Priority Data

Dec. 28, 2021 (CN) ............. 202111623111.4

(51) Int. Cl.
*H10D 62/10* (2025.01)
*H10D 84/01* (2025.01)
*H10D 84/03* (2025.01)

(52) U.S. Cl.
CPC ....... *H10D 62/115* (2025.01); *H10D 84/0151* (2025.01); *H10D 84/038* (2025.01)

(58) Field of Classification Search
CPC ......... H01L 27/088; H01L 21/823481; H01L 29/0649; H01L 21/823462; H01L 21/823857; H01L 21/8249; H01L 21/28185; H01L 21/28229; H01L 21/28211; H01L 21/823456; H01L 21/31111; H01L 29/42364; H01L 29/0847; H01L 21/823418; H01L 29/66553; H01L 21/823468; H01L 29/665; H01L 29/7833; H01L 29/66575; H01L 29/6656; H01L 21/823437; H01L 29/7847; H01L 29/6653
USPC .......... 257/500, 506, 315, 390, 358, E21.54, 257/E29.02, E27.015, E21.546; 438/424, 438/400, 257, 290, 585, 592, 284, 275,
(Continued)

(56) References Cited

U.S. PATENT DOCUMENTS 5,908,311 A * 6/1999 Chi .................. H10B 41/40
                                                    438/258
6,033,958 A * 3/2000 Chou ............ H01L 21/823462
                                                    438/275
(Continued)

FOREIGN PATENT DOCUMENTS

JP    2002-280446 A    9/2002
JP     2003-60025 A    2/2003
(Continued)

*Primary Examiner* — Mouloucoulaye Inoussa
(74) *Attorney, Agent, or Firm* — Winston Hsu

(57) ABSTRACT

A semiconductor structure includes a substrate having a first device region and a second device region in proximity to the first device region. A trench isolation structure is disposed in the substrate between the first device region and the second device region. The trench isolation structure includes a first bottom surface within the first device region and a second bottom surface within the second device region. The first bottom surface is coplanar with the second bottom surface.

5 Claims, 5 Drawing Sheets

(58) Field of Classification Search
USPC ....... 438/241, 287, 258, 763, 981, 776, 197, 438/253, 296
See application file for complete search history.

(56) References Cited

U.S. PATENT DOCUMENTS

| | | | | |
|---|---|---|---|---|
| 6,228,708 | B1* | 5/2001 | Chang | H01L 21/823462 438/296 |
| 6,566,207 | B2 | 5/2003 | Park | |
| 6,657,248 | B1* | 12/2003 | Matsuzaki | H01L 27/105 257/306 |
| 6,734,113 | B1* | 5/2004 | Cho | H01L 21/28202 257/E21.639 |
| 9,972,678 | B2 | 5/2018 | Hsiung | |
| 10,008,573 | B1* | 6/2018 | Hsiao | H01L 29/7833 |
| 10,985,071 | B1* | 4/2021 | Yang | H01L 21/823857 |
| 2003/0067050 | A1* | 4/2003 | Kim | H01L 21/823481 257/E21.546 |
| 2003/0224575 | A1* | 12/2003 | Hinoue | H01L 21/823462 257/E21.639 |
| 2004/0043558 | A1* | 3/2004 | Wieczorek | H01L 27/0805 257/E27.048 |
| 2004/0102052 | A1* | 5/2004 | Ohmi | H01L 27/12 257/E21.279 |
| 2004/0185624 | A1* | 9/2004 | Tamura | H01L 21/28202 257/E27.081 |
| 2005/0224864 | A1* | 10/2005 | Hashimoto | H10B 41/44 438/257 |
| 2005/0250342 | A1* | 11/2005 | Ueda | H01L 27/0629 438/981 |
| 2006/0008996 | A1* | 1/2006 | Cho | H10B 43/30 257/E21.679 |
| 2006/0148163 | A1 | 7/2006 | Wieczorek | |
| 2006/0220097 | A1* | 10/2006 | Ogura | H10B 41/40 257/315 |
| 2006/0220171 | A1* | 10/2006 | Choi | H01L 21/76229 257/500 |
| 2006/0281251 | A1* | 12/2006 | Chen | H01L 21/823481 257/E21.628 |
| 2007/0293029 | A1* | 12/2007 | Ogawa | H01L 21/823857 257/E21.639 |
| 2007/0298571 | A1* | 12/2007 | Park | H10B 41/49 257/E21.546 |
| 2008/0067599 | A1* | 3/2008 | Tsutsumi | H01L 21/823814 257/E27.035 |
| 2009/0261396 | A1* | 10/2009 | Gogoi | H01L 27/105 257/E27.084 |
| 2009/0261446 | A1* | 10/2009 | Gogoi | H01L 21/823412 257/E21.546 |
| 2010/0120213 | A1* | 5/2010 | Choi | H10B 12/038 257/E21.66 |
| 2011/0217817 | A1* | 9/2011 | Kim | H01L 27/105 257/E21.409 |
| 2015/0060971 | A1* | 3/2015 | Fujii | H10B 41/44 257/300 |
| 2015/0294984 | A1* | 10/2015 | Cheng | H01L 21/7624 438/151 |
| 2016/0172190 | A1* | 6/2016 | Shih | H01L 21/823462 438/745 |
| 2017/0018430 | A1* | 1/2017 | Peng | H01L 23/535 |
| 2018/0102408 | A1* | 4/2018 | Hsiung | H01L 29/0649 |
| 2018/0190537 | A1* | 7/2018 | Li | H01L 21/0332 |
| 2018/0286481 | A1* | 10/2018 | Nagai | H01L 21/28035 |
| 2019/0157421 | A1* | 5/2019 | Wang | H01L 21/823456 |
| 2019/0326318 | A1* | 10/2019 | Jung | H10B 43/40 |
| 2019/0355837 | A1* | 11/2019 | Liew | H01L 21/31111 |
| 2021/0013220 | A1* | 1/2021 | Lin | H01L 29/0649 |

FOREIGN PATENT DOCUMENTS

| | | |
|---|---|---|
| JP | 2012-28562 A | 2/2012 |
| JP | 2016-122773 A | 7/2016 |
| KR | 2003-0011999 A | 2/2003 |

\* cited by examiner

SEMICONDUCTOR STRUCTURE AND FABRICATION METHOD THEREOF

BACKGROUND OF THE INVENTION

1. Field of the Invention

The present invention relates to the field of semiconductor technology, in particular to a semiconductor structure and a manufacturing method thereof.

2. Description of the Prior Art

The development of semiconductor integrated circuit technology progresses continuously and circuit designs in products of the new generation become smaller and more complicated than those of the former generation. In some products, semiconductor devices having different threshold voltages and/or operation voltages are required in the integrated circuits, and the structures of the semiconductor devices may be different from one another for realizing different threshold voltages and/or operation voltages. For example, a relatively thicker gate oxide layer may be used to enhance the operation voltage of a semiconductor device in the relatively higher voltage area, and height differences between parts in the relatively higher voltage area and parts in the relatively lower voltage area may be generated accordingly. The height differences may cause problems in the related manufacturing processes and have negative influence on the manufacturing yield.

SUMMARY OF THE INVENTION

It is one object of the present invention to provide an improved semiconductor structure and a fabrication method thereof to solve the above-mentioned shortcomings or deficiencies of the prior art.

One aspect of the invention provides a semiconductor structure including a substrate comprising a first device region and a second device region in proximity to the first device region, and a trench isolation structure in the substrate between the first device region and the second device region. The trench isolation structure comprises a first bottom surface within the first device region and a second bottom surface within the second device region. The first bottom surface is coplanar with the second bottom surface.

According to some embodiments, the trench isolation structure comprises a first top surface within the first device region and a second top surface within the second device region, wherein the first top surface is coplanar with the second top surface.

According to some embodiments, the first device region is a medium-voltage device region and the second device region is a low-voltage device region.

According to some embodiments, a top surface of the substrate within the first device region is lower than a top surface of the substrate within the second device region.

According to some embodiments, the semiconductor structure further includes a first gate oxide layer on the top surface of the substrate within the first device region, and a second gate oxide layer on the top surface of the substrate within the second device region, wherein the first gate oxide layer is thicker than the second gate oxide layer.

According to some embodiments, the semiconductor structure further includes a first gate disposed on the first gate oxide layer within the first device region, and a second gate disposed on the second gate oxide layer within the second device region.

According to some embodiments, the first gate and the second gate are metal gates.

Another aspect of the invention provides a method for fabricating a semiconductor structure. A substrate is provided, which includes a first device region and a second device region in proximity to the first device region. A trench isolation structure is formed in the substrate between the first device region and the second device region. A mask layer is conformally deposited on the substrate to cover the first device region, the second device region, and the trench isolation structure. A first resist pattern is formed on the mask layer. The first resist pattern covers the trench isolation structure and the second device region. The mask layer and a pad oxide layer which are not covered by the first resist pattern are then removed from the first device region, thereby exposing a top surface of the substrate in the first device region. The first resist pattern is then removed. The top surface of the substrate in the first device region is oxidized to form a sacrificial oxide layer. The sacrificial oxide layer is then removed to expose the top surface of the substrate in the first device region. The mask layer is removed to expose a top surface of the trench isolation structure.

According to some embodiments, the mask layer is a silicon nitride layer.

According to some embodiments, the mask layer has a thickness of about 200-220 angstroms.

According to some embodiments, the pad oxide layer has a thickness of about 100-110 angstroms.

According to some embodiments, the method further includes the step of growing a first gate oxide layer on the top surface of the substrate in the first device region after removing the mask layer.

According to some embodiments, the first gate oxide layer has a thickness of about 200-220 angstroms.

According to some embodiments, a thickness of the top surface of the substrate in the first device region consumed by forming the sacrificial oxide layer is about 190-210 angstroms.

According to some embodiments, a second resist pattern is formed on the substrate. The second resist pattern covers the first gate oxide layer within the first device region, but does not cover the trench isolation structure and the second device region. The trench isolation structure and the second device region are then etched, thereby exposing a top surface of the substrate in the second device region. The second resist pattern is then removed.

According to some embodiments, the method further includes the step of growing a second gate oxide layer on the top surface of the substrate in the second device region.

According to some embodiments, the trench isolation structure comprises a first top surface within the first device region and a second top surface within the second device region, wherein the first top surface is coplanar with the second top surface.

According to some embodiments, the top surface of the substrate in the first device region is lower than the top surface of the substrate in the second device region.

According to some embodiments, the trench isolation structure comprises a first bottom surface within the first device region and a second bottom surface within the second device region, wherein the first bottom surface is coplanar with the second bottom surface.

According to some embodiments, the first device region is a medium-voltage device region and the second device region is a low-voltage device region.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
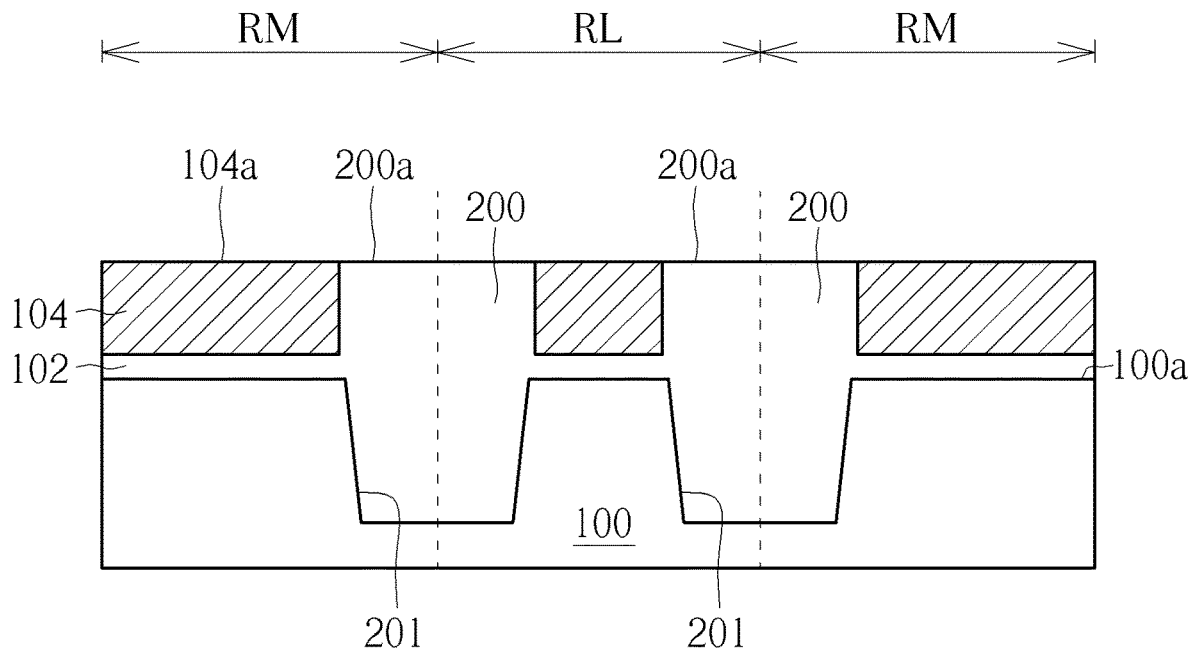
FIG. 1 to FIG. 10 are schematic cross-sectional diagrams illustrating a method of fabricating a semiconductor structure according to an embodiment of the present invention.

Please refer to FIG. 1 to FIG. 10, which are schematic cross-sectional diagrams of a method for fabricating a semiconductor structure according to an embodiment of the present invention. As shown in FIG. 1, first, a substrate 100 is provided, for example, a semiconductor substrate such as a silicon substrate. According to an embodiment of the present invention, the substrate 100 includes a first device region RM and a second device region RL in proximity to the first device region RM. According to an embodiment of the present invention, the first device region RM is a medium-voltage device region, and the second device region RL is a low-voltage device region. A trench isolation structure 200, for example, shallow trench isolation (STI) structure, is formed in the substrate 100 between the first device region RM and the second device region RL.

According to an embodiment of the present invention, for example, to form the trench isolation structure 200, a pad oxide layer 102 and a pad nitride layer 104 are first deposited on the top surface 100a of the substrate 100. The pad nitride layer 104 is then patterned by a lithography process and an etching process. An etching process is then performed to form a trench 201 in the substrate 100. An insulating layer is then deposited in the trench 201, and is planarized by a chemical mechanical polishing (CMP) process to complete the trench isolation structure 200. At this point, the top surface 200a of the trench isolation structure 200 and the top surface 104a of the pad nitride layer 104 are coplanar.

Figure 2:
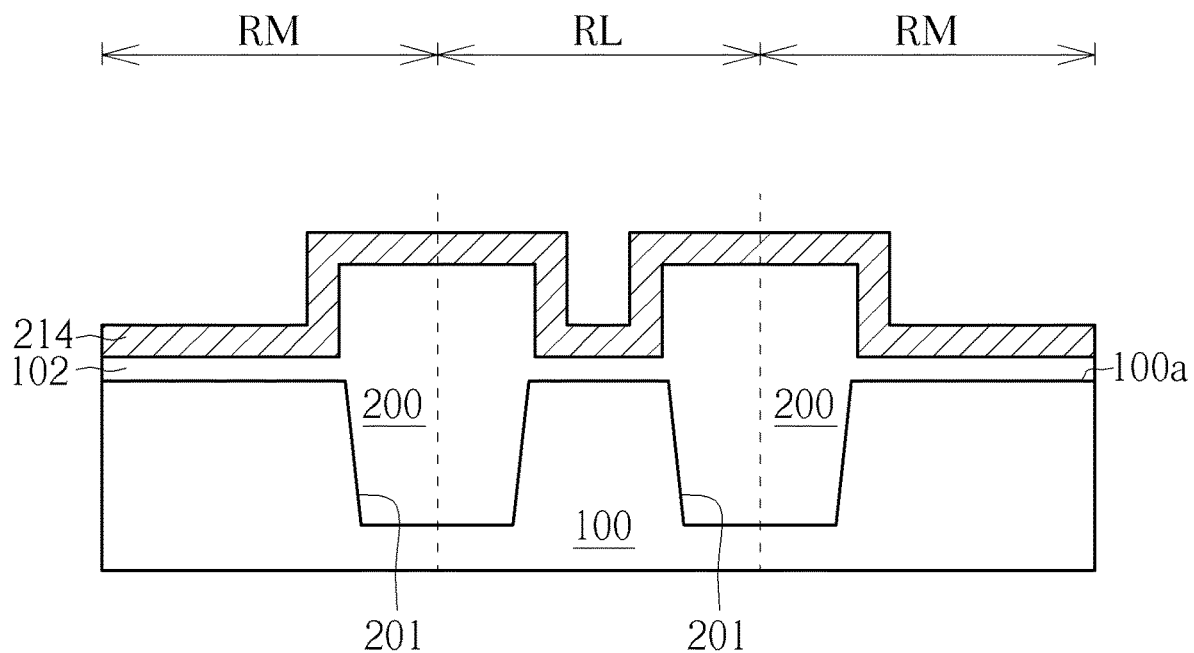

As shown in FIG. 2, subsequently, the pad nitride layer 104 is selectively removed, and the pad oxide layer 102 is exposed. At this point, the top of the trench isolation structure 200 may protrude from the pad oxide layer 102. Threshold voltage (Vt) implantation processes may be performed to adjust the dopant concentration of the first device region RM and the second device region RL respectively.

Subsequently, a mask layer 214 is conformally deposited on the substrate 100 to cover the first device region RM, the second device region RL, and the trench isolation structure 200. According to an embodiment of the present invention, the mask layer 214 is a silicon nitride layer. According to an embodiment of the present invention, the thickness of the mask layer 214 is about 200-220 angstroms. According to an embodiment of the present invention, the thickness of the pad oxide layer 102 is about 100-110 angstroms.

Figure 3:
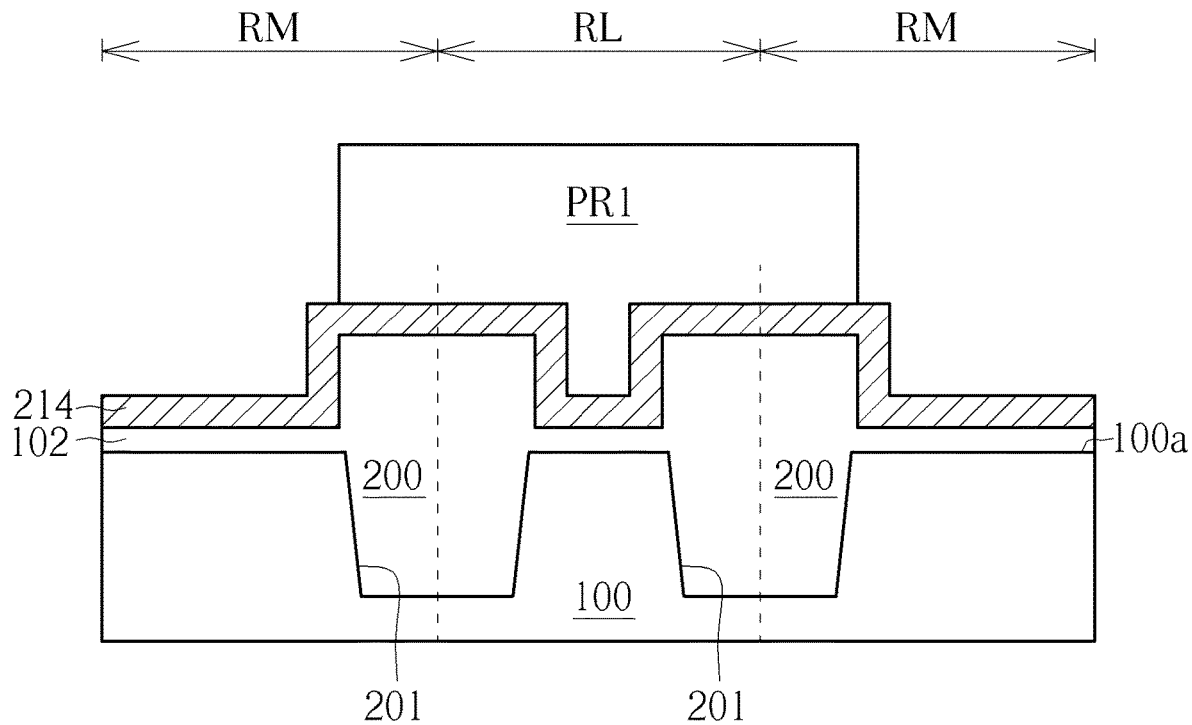

As shown in FIG. 3, a first photoresist pattern PR1 is formed on the mask layer 214. The first photoresist pattern PR1 covers the trench isolation structure 200 and the second device region RL. According to an embodiment of the present invention, the formation of the first photoresist pattern PR1 involves multiple steps such as photoresist coating, exposure, development, and baking. Since the formation of the photoresist pattern is a well-known technology, the details will not be repeated.

Figure 4:
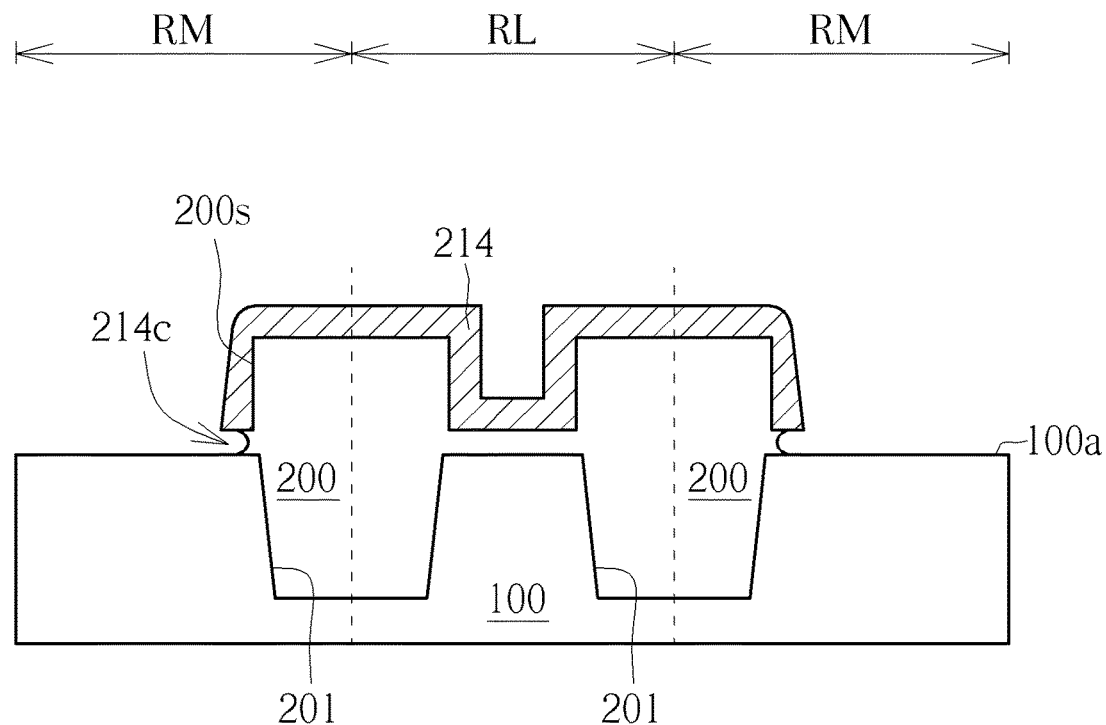

As shown in FIG. 4, subsequently, the mask layer 214 and the pad oxide layer 102 that are not covered by the first photoresist pattern PR1 are removed from the first device region RL, thereby exposing the top surface 100a of the substrate 100 in the first device region RL. According to an embodiment of the present invention, the method for removing the mask layer 214 may include dry etching and wet etching. For example, an anisotropic dry etching process is first performed to etch the mask layer 214 not covered by the first photoresist pattern PR1, and the pad oxide layer 102 is then selectively removed by a wet etching process. At this point, an undercut structure 214c may be formed near the trench isolation structure 200 and under the mask layer 214 on the sidewall 200s of the trench isolation structure 200. Subsequently, the first photoresist pattern PR1 is removed.

Figure 5:
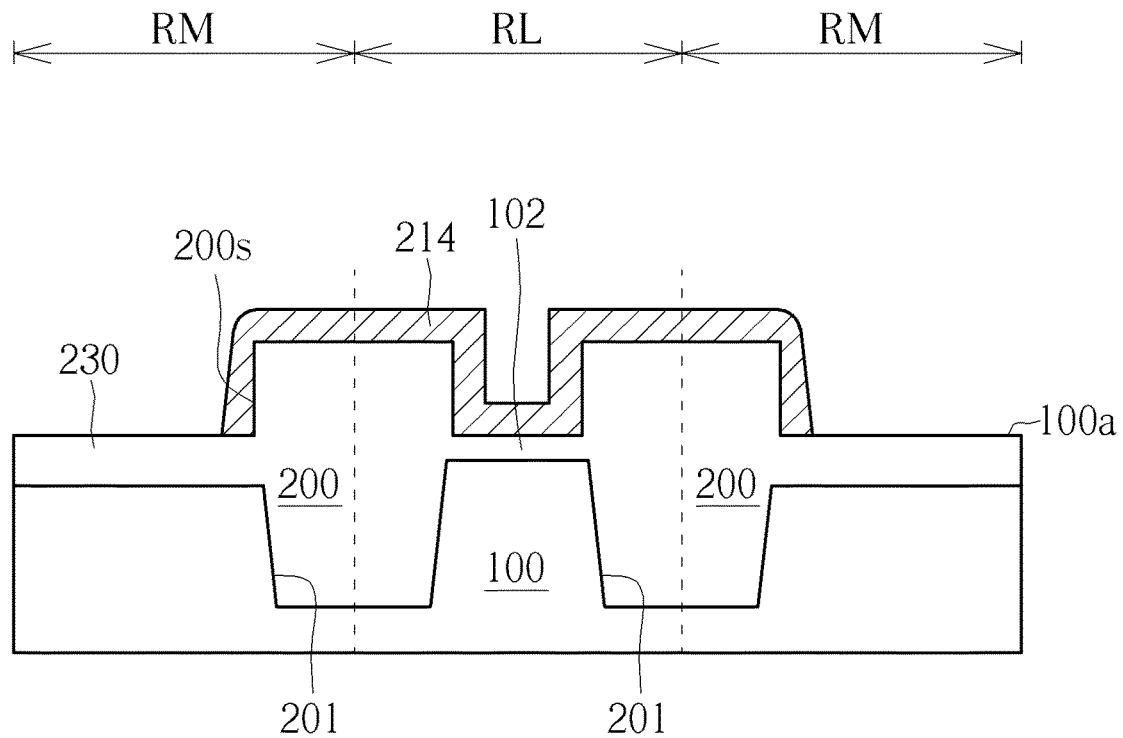

As shown in FIG. 5, an oxidation process is then performed to oxidize the top surface 100a of the substrate 100 in the first device region RM to form a sacrificial oxide layer 230. According to an embodiment of the present invention, the thickness of the sacrificial oxide layer 230 is about 420-450 angstroms, for example, 440 angstroms. According to an embodiment of the present invention, when the sacrificial oxide layer 230 is formed, the consumed thickness of the top surface 100a of the substrate 100 of the first device region RM is about 190-210 angstroms. According to an embodiment of the present invention, the undercut structure 214c may be filled with the sacrificial oxide layer 230.

Figure 6:
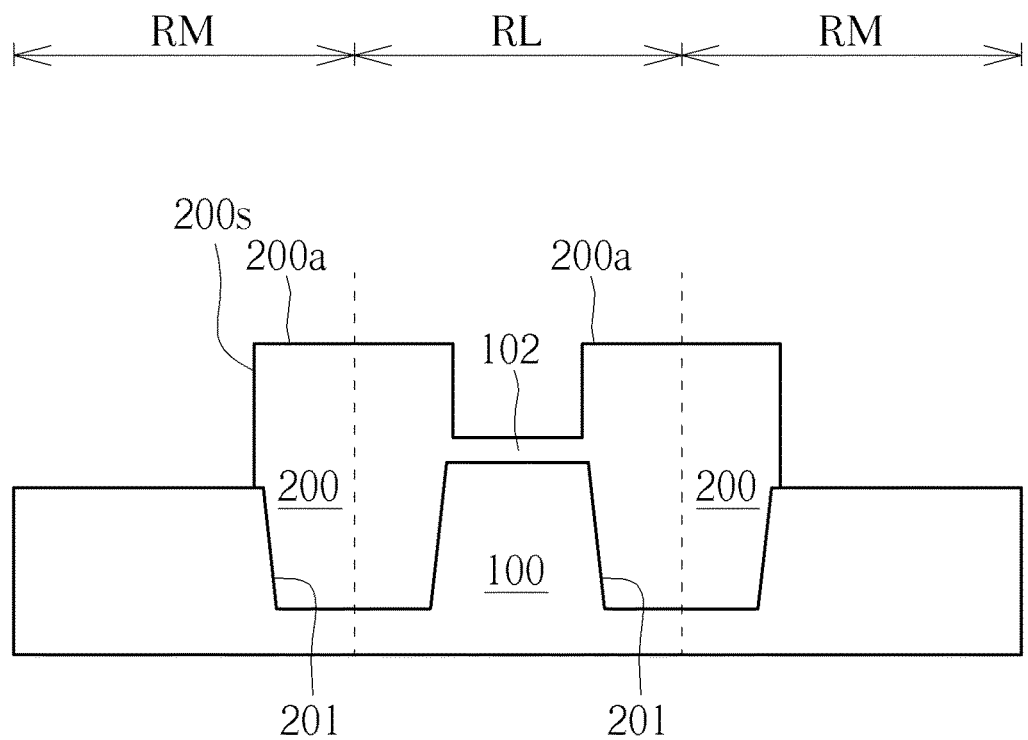

As shown in FIG. 6, subsequently, the sacrificial oxide layer 230 is selectively removed to expose the top surface 100a of the substrate 100 in the first device region RM. According to an embodiment of the present invention, the method of selectively removing the sacrificial oxide layer 230 may be implemented by using a diluted hydrofluoric acid (DHF) solution. Subsequently, the remaining mask layer 214 is removed to expose the top surface 200a of the trench isolation structure 200 and the pad oxide layer 102 in the second device region RL.

Figure 7:
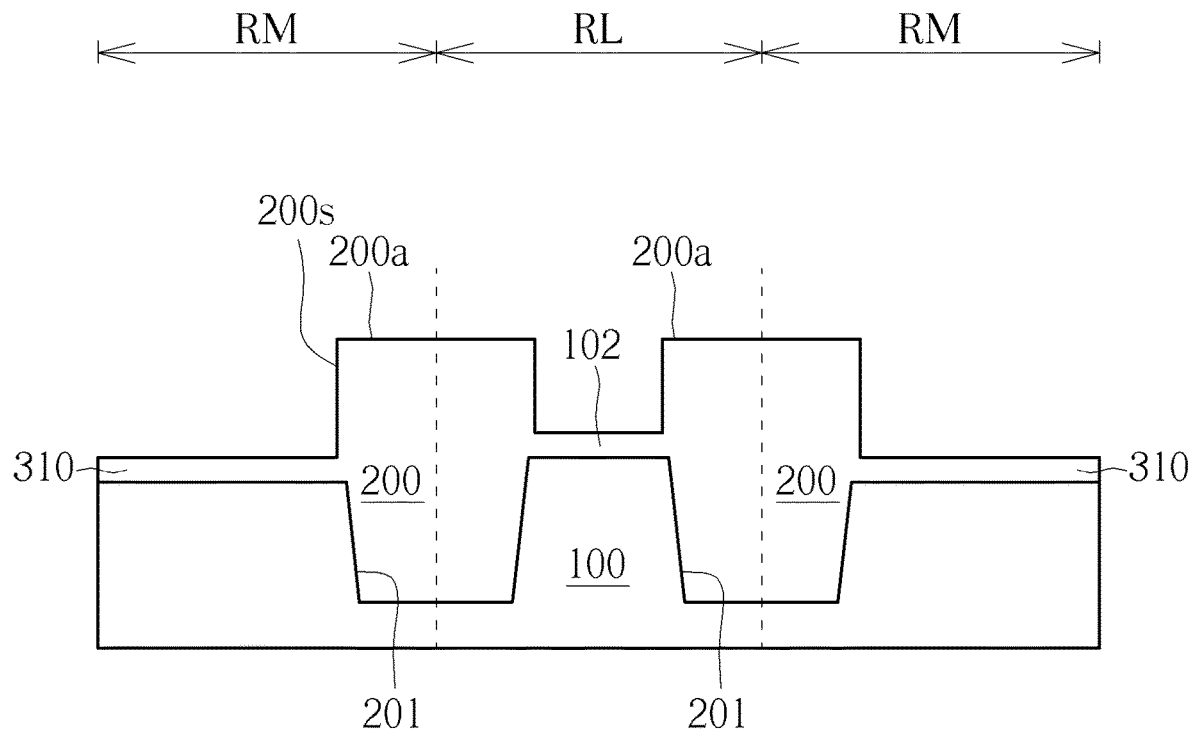

As shown in FIG. 7, after the mask layer 214 is removed, a first gate oxide layer 310 is grown on the top surface 100a of the substrate 100 in the first device region RM by using an oxidation process. According to an embodiment of the present invention, the thickness of the first gate oxide layer 310 is about 200-220 angstroms.

Figure 8:
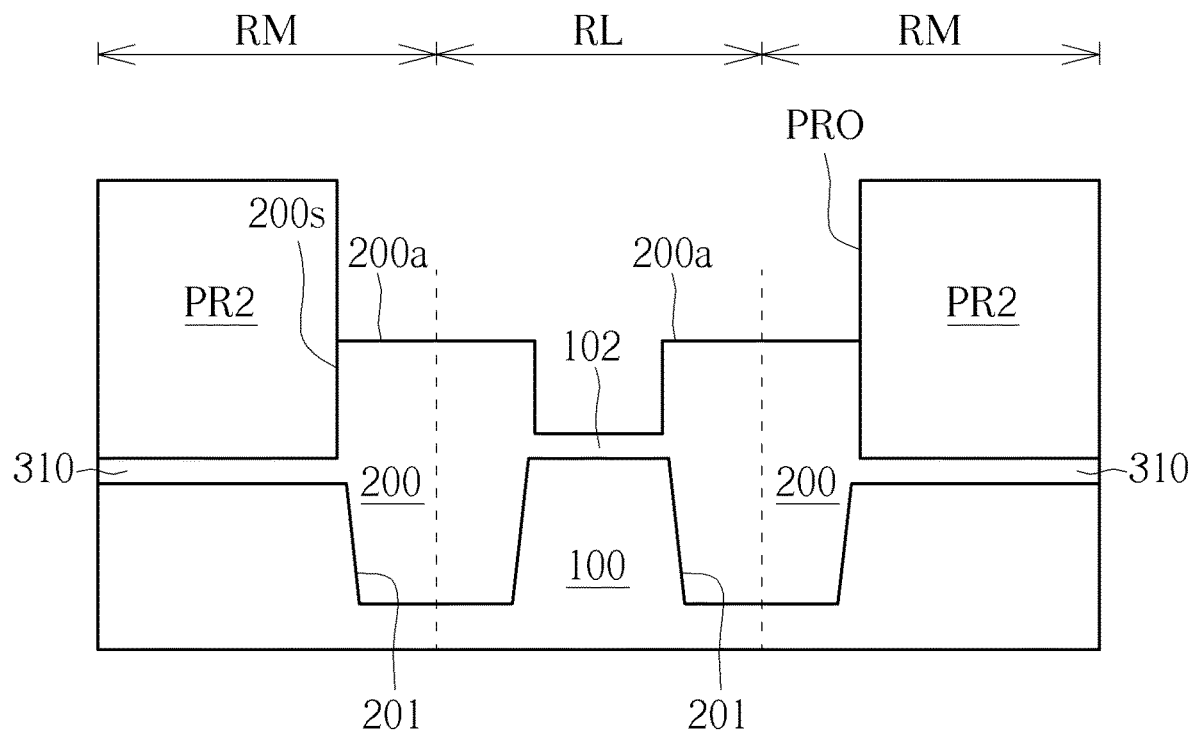

As shown in FIG. 8, next, a second photoresist pattern PR2 is formed on the substrate 100. The second photoresist pattern PR2 covers the first gate oxide layer 310 in the first device region RM, but does not cover the trench isolation structure 200 and the second device region RL. According to an embodiment of the present invention, the opening PRO of the second photoresist pattern PR2 exposes the trench isolation structure 200 and the pad oxide layer 102 in the second device region RL.

Figure 9:
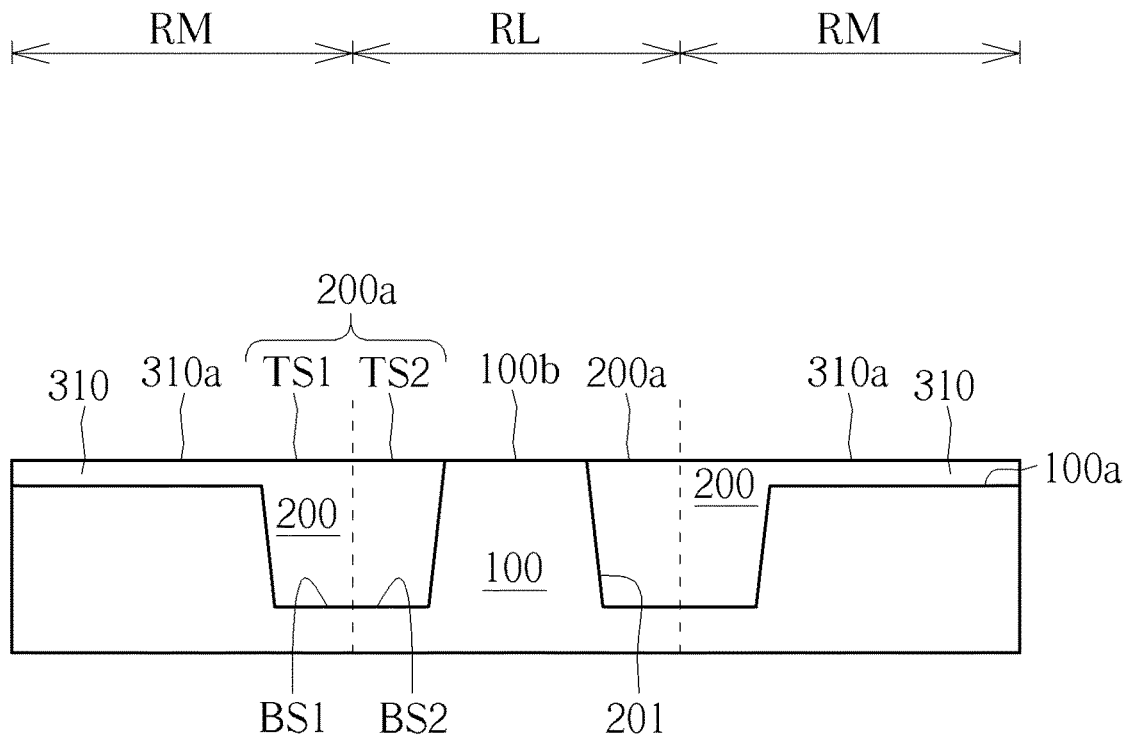

As shown in FIG. 9, an etching process is performed to etch the trench isolation structure 200 and the pad oxide layer 102 in the second device region RL through the opening PRO of the second photoresist pattern PR2, thereby exposing the top surface 100b of the substrate 100 in the second device region RL. Then, the second photoresist pattern PR2 is removed. At this point, the top surface 310a of the first gate oxide layer 310 in the first device region RM is approximately flush with the top surface 200a of the trench isolation structure 200 and the top surface 100b of the substrate 100 in the second device region RL.

According to an embodiment of the present invention, the top surface 200a of the trench isolation structure 200 includes a first top surface TS1 in the first device region RM and a second top surface TS2 in the second device region RL. The first top surface TS1 is flush with the second top surface TS2. According to an embodiment of the present invention, the trench isolation structure 200 includes a first bottom surface BS1 in the first device region RM and a second bottom surface BS2 in the second device region RL. The first bottom surface BS1 is flush with the second bottom surface BS2. According to an embodiment of the present invention, the top surface 100a of the substrate 100 in the first device region RM is lower than the top surface 100b of the substrate 100 in the second device region RL.

Figure 10:
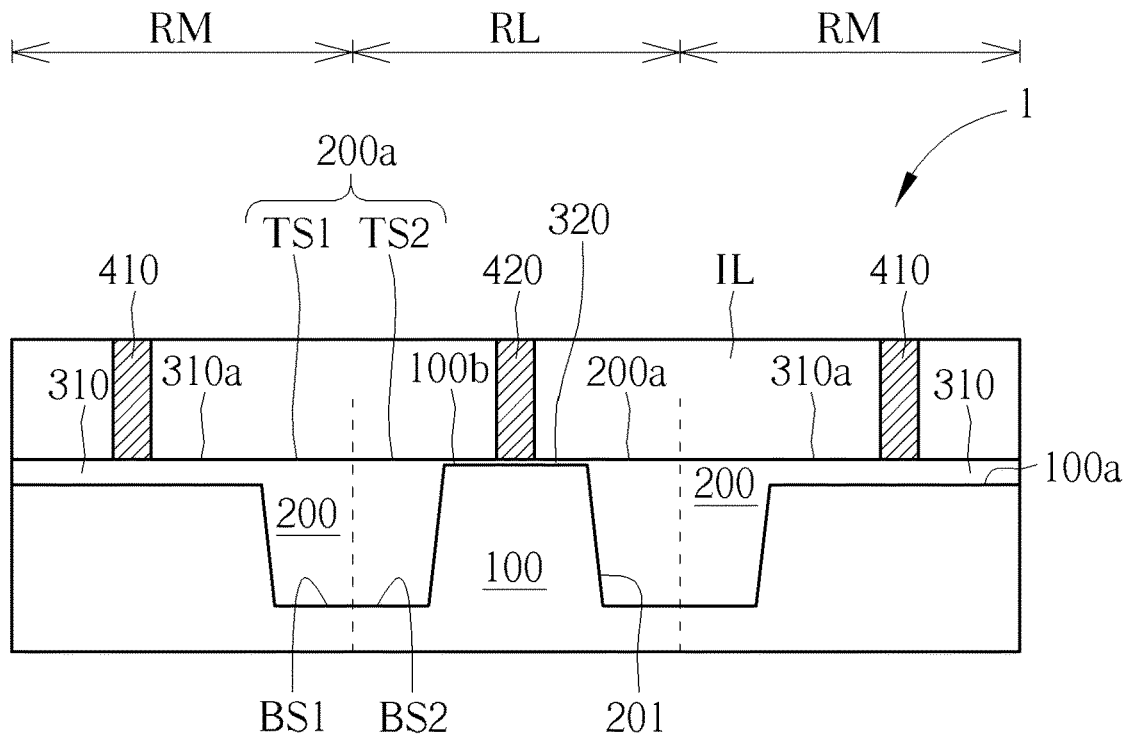

As shown in FIG. 10, next, a second gate oxide layer 320 is grown on the top surface 100b of the substrate 100 in the second device region RL by using an oxidation process. According to an embodiment of the present invention, for example, the thickness of the second gate oxide layer 320 is about 10 angstroms, but it is not limited thereto. Subsequently, a first gate 410 and a second gate 420 are formed on the first gate oxide layer 310 in the first device region RM and the second gate oxide layer 320 in the second device region RL, respectively. According to an embodiment of the present invention, the first gate 410 and the second gate 420 may be surrounded by the dielectric layer IL. According to an embodiment of the present invention, for example, the first gate 410 and the second gate 420 may be metal gates.

The structural features of the present invention can be seen from FIG. 10. The semiconductor structure 1 includes a substrate 100 having thereon a first device region RM and a second device region RL in proximity to the first device region RM. The trench isolation structure 200 is provided in the substrate 100 between the first device region RM and the second device region RL. The trench isolation structure 200 includes the first bottom surface BS1 in the first device region RM and the second bottom surface BS2 in the second device region RL. The first bottom surface BS1 is coplanar with the second bottom surface BS2.

According to an embodiment of the present invention, the trench isolation structure 200 includes a first top surface TS1 in the first device region RM and a second top surface TS2 in the second device region RL. The first top surface TS1 and the second top surface TS2 are coplanar.

According to an embodiment of the present invention, the first device region RM is a medium-voltage device region, and the second device region RL is a low-voltage device region.

According to an embodiment of the present invention, the top surface 100a of the substrate 100 in the first device region RM is lower than the top surface 100b of the substrate 100 in the second device region RL.

According to an embodiment of the present invention, the semiconductor structure 1 further includes a first gate oxide layer 310 located on the top surface 100a of the substrate 100 in the first device region RM, and a second gate oxide layer 320 located on the top surface 100b of the substrate 100 in the second device region RL. According to an embodiment of the present invention, the first gate oxide layer 310 is thicker than the second gate oxide layer 320.

According to an embodiment of the present invention, the semiconductor structure 1 further includes a first gate 410 disposed on the first gate oxide layer 310 in the first device region RM, and a second gate 420 disposed on the second gate oxide layer 320 in the second device region RL. According to an embodiment of the present invention, for example, the first gate 410 and the second gate 420 may be metal gates.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate comprising a first device region and a second device region in proximity to the first device region, wherein the first device region is a medium-voltage device region and the second device region is a low-voltage device region;
   a trench isolation structure in the substrate between the first device region and the second device region, wherein the trench isolation structure comprises a first bottom surface within the first device region and a second bottom surface within the second device region, wherein the first bottom surface is coplanar with the second bottom surface, wherein the trench isolation structure comprises a first top surface within the first device region and a second top surface within the second device region, wherein the first top surface is coplanar with the second top surface, wherein a top surface of the substrate within the first device region is lower than a top surface of the substrate within the second device region;
   a first gate oxide layer on the top surface of the substrate within the first device region; and
   a second gate oxide layer on the top surface of the substrate within the second device region, wherein the first gate oxide layer and the second gate oxide layer are in direct contact with the trench isolation structure.

2. The semiconductor structure according to claim 1, wherein the trench isolation structure comprises a first top surface within the first device region and a second top surface within the second device region, wherein the first top surface is coplanar with the second top surface.

3. The semiconductor structure according to claim 1, wherein the first gate oxide layer is thicker than the second gate oxide layer.

4. The semiconductor structure according to claim 3 further comprising:
   a first gate disposed on the first gate oxide layer within the first device region; and
   a second gate disposed on the second gate oxide layer within the second device region.

5. The semiconductor structure according to claim 4, wherein the first gate and the second gate are metal gates.

* * * * *